(12) United States Patent
Zhou et al.

(10) Patent No.: US 9,059,416 B2
(45) Date of Patent: Jun. 16, 2015

(54) SUBSTRATE, MANUFACTURING METHOD THEREOF, AND ORGANO-ELECTROLUMINESCENT DEVICE USING THE SAME

(75) Inventors: Mingjie Zhou, Guangdong (CN); Ping Wang, Guangdong (CN); Xiaoming Feng, Guangdong (CN); Hui Huang, Guangdong (CN)

(73) Assignee: Ocean's King Lighting Science & Technology Co., Ltd., Guangdong (CN)

( * ) Notice: Subject to any disclaimer, the term of this patent is extended or adjusted under 35 U.S.C. 154(b) by 63 days.

(21) Appl. No.: 13/983,603

(22) PCT Filed: Mar. 30, 2011

(86) PCT No.: PCT/CN2011/072304
§ 371 (c)(1),
(2), (4) Date: Aug. 21, 2013

(87) PCT Pub. No.: WO2012/129793
PCT Pub. Date: Oct. 4, 2012

(65) Prior Publication Data
US 2013/0313541 A1 Nov. 28, 2013

(51) Int. Cl.
*H01L 21/00* (2006.01)
*B32B 27/10* (2006.01)
(Continued)

(52) U.S. Cl.
CPC ..... *H01L 51/0097* (2013.01); *Y10T 428/24975* (2015.01); *Y10T 428/266* (2015.01);
(Continued)

(58) Field of Classification Search
CPC .................... H01L 51/0097; B32B 27/10

USPC ............................................ 257/40; 438/406
See application file for complete search history.

(56) References Cited

U.S. PATENT DOCUMENTS 3,226,272 A * 12/1965 Longfellow ..................... 156/67
3,922,473 A * 11/1975 Kosaka et al. ................ 428/463
(Continued)

FOREIGN PATENT DOCUMENTS

CN    1144672 C    4/2004
CN    101079473 A  11/2007
(Continued)

OTHER PUBLICATIONS

International Search Report for corresponding International Application No. PCT/CN2011/072304 mailed Dec. 1, 2011.
(Continued)

*Primary Examiner* — Earl Taylor
(74) *Attorney, Agent, or Firm* — Renner, Otto, Boisselle & Sklar, LLP

(57) ABSTRACT

A substrate, manufacturing method thereof, and an organic electroluminescent device using the same are provided, belonging to photoelectron field. The substrate includes a paper layer (102), a first protection layer (101) formed on the lower surface of the paper layer, and a second protection layer (103) formed on the upper surface and covering the same of the paper layer. The substrate, solves problems of paper which is easy to absorb humidity and has high permeability of oxygen by a protection processing that said paper is coated with the heat seal film of polyethylene terephthalate coated with Polyvinyl Dichloride. At the meantime, the substrate has the advantages of cheap material, extensive sources, simple manufacturing process, good flexibility of the substrate, and good capability of preventing the permeability of water as well.

6 Claims, 2 Drawing Sheets

(51) Int. Cl.
  *B32B 3/04* (2006.01)
  *B32B 27/08* (2006.01)
  *B32B 27/30* (2006.01)
  *B32B 27/36* (2006.01)
  *H01L 51/52* (2006.01)
  *H01L 51/00* (2006.01)

(52) U.S. Cl.
  CPC ............... *B32B 3/04* (2013.01); *B32B 27/08* (2013.01); *B32B 27/10* (2013.01); *B32B 27/304* (2013.01); *B32B 27/36* (2013.01); *B32B 2307/31* (2013.01); *B32B 2307/7265* (2013.01); *B32B 2457/206* (2013.01); *H01L 51/5253* (2013.01); *Y02E 10/549* (2013.01)

(56) References Cited

U.S. PATENT DOCUMENTS

| | | | |
|---|---|---|---|
| 4,497,872 A | 2/1985 | Hoppe et al. | |
| 4,894,686 A * | 1/1990 | Bujese | 399/297 |
| 5,626,947 A * | 5/1997 | Hauer et al. | 428/195.1 |
| 6,242,076 B1 * | 6/2001 | Andriash | 428/138 |
| 6,534,139 B1 * | 3/2003 | Gibbons et al. | 428/35.7 |
| 6,570,323 B1 * | 5/2003 | Nakamata et al. | 313/500 |
| 6,570,325 B2 * | 5/2003 | Graff et al. | 313/506 |
| 6,709,542 B1 * | 3/2004 | Naito et al. | 156/235 |
| 7,133,592 B2 * | 11/2006 | Yasuda et al. | 385/145 |
| 7,229,698 B2 * | 6/2007 | Encio Martinez et al. | 428/503 |
| 7,295,742 B2 * | 11/2007 | Sugita et al. | 385/129 |
| 7,316,839 B2 * | 1/2008 | Knauf | 428/292.1 |
| 7,482,620 B2 * | 1/2009 | Kugler et al. | 257/40 |
| 7,537,948 B2 * | 5/2009 | Hayashi et al. | 438/29 |
| 7,548,678 B2 * | 6/2009 | Sugita et al. | 385/129 |
| 7,582,895 B2 * | 9/2009 | Armgarth et al. | 257/40 |
| 7,679,110 B2 * | 3/2010 | Armgarth et al. | 257/253 |
| 7,718,555 B1 * | 5/2010 | Smith et al. | 442/50 |
| 8,071,191 B2 * | 12/2011 | Knauf | 428/36.1 |
| 8,167,628 B2 * | 5/2012 | Yoon et al. | 439/77 |
| 8,258,240 B2 * | 9/2012 | Suzuki et al. | 525/228 |
| 8,501,640 B2 * | 8/2013 | Suzuki et al. | 442/151 |
| 2002/0125822 A1 | 9/2002 | Graff et al. | 313/506 |
| 2004/0213970 A1 * | 10/2004 | Knauf | 428/204 |
| 2005/0029513 A1 | 2/2005 | Kawashima et al. | |
| 2005/0194898 A1 * | 9/2005 | Kharrazi-Olsson et al. | 313/512 |
| 2005/0233116 A1 * | 10/2005 | Mueller et al. | 428/192 |
| 2006/0093656 A1 * | 5/2006 | Muta et al. | 424/448 |
| 2006/0133762 A1 * | 6/2006 | Yasuda et al. | 385/145 |
| 2007/0273280 A1 * | 11/2007 | Kim et al. | 313/509 |
| 2008/0037944 A1 * | 2/2008 | Sugita et al. | 385/131 |
| 2008/0095961 A1 * | 4/2008 | Knauf | 428/36.1 |
| 2008/0099756 A1 * | 5/2008 | Klauk et al. | 257/40 |
| 2008/0128687 A1 * | 6/2008 | Armgarth et al. | 257/40 |
| 2009/0042004 A1 * | 2/2009 | Yano et al. | 428/220 |
| 2009/0066345 A1 * | 3/2009 | Klauk et al. | 324/661 |
| 2009/0090907 A1 * | 4/2009 | Kugler et al. | 257/40 |
| 2009/0105071 A1 * | 4/2009 | Principe et al. | 503/227 |
| 2009/0134778 A1 * | 5/2009 | Nishizeki et al. | 313/504 |
| 2010/0099317 A1 * | 4/2010 | Suzuki et al. | 442/149 |
| 2010/0099318 A1 * | 4/2010 | Suzuki et al. | 442/151 |
| 2010/0178452 A1 * | 7/2010 | Yoon et al. | 428/107 |
| 2010/0203108 A1 * | 8/2010 | Terashi et al. | 424/447 |
| 2013/0040155 A1 * | 2/2013 | Knauf | 428/475.8 |
| 2013/0099215 A1 * | 4/2013 | Kushida et al. | 257/40 |
| 2013/0202677 A1 * | 8/2013 | Komoda et al. | 424/443 |
| 2013/0287823 A1 * | 10/2013 | Udagawa et al. | 424/400 |
| 2013/0313541 A1 * | 11/2013 | Zhou et al. | 257/40 |
| 2014/0141059 A1 * | 5/2014 | Komoda et al. | 424/448 |

FOREIGN PATENT DOCUMENTS

| | | | |
|---|---|---|---|
| CN | 101147902 A * | 3/2008 | |
| CN | 101417524 A | 4/2009 | |
| CN | 101710608 A * | 5/2010 | |
| JP | 02-58023 A | 2/1990 | |
| JP | 2001-009963 A | 1/2001 | |
| JP | 2002-283492 A | 10/2002 | |
| JP | 2004-335207 A | 11/2004 | |
| JP | 2006-137932 A | 6/2006 | |
| JP | 2006-188643 A | 7/2006 | |
| JP | 2007-526601 A | 9/2007 | |
| JP | 2009-215547 A | 9/2009 | |
| JP | 2010-023275 A | 2/2010 | |
| WO | 2009/038310 | 3/2009 | |
| WO | WO 2009038310 A1 * | 3/2009 | |
| WO | WO 2011125307 A1 * | 10/2011 | |
| WO | WO 2012129793 A1 * | 10/2012 | |

OTHER PUBLICATIONS

Office Action issued in corresponding Japanese Application No. 2014-501392 dated Aug. 26, 2014.

Extended European Search Report issued in corresponding European Application No. 11862835.3 dated Feb. 20, 2015.

Lee et al., "29.2: Top Emission Organic EL Display on Paper Substrate", 2004 SID International Symposium, May 25-27, 2004, pp. 1005-1007.

* cited by examiner

SUBSTRATE, MANUFACTURING METHOD THEREOF, AND ORGANO-ELECTROLUMINESCENT DEVICE USING THE SAME

This application is a national phase of International Application No. PCT/CN2011/072304 filed Mar. 30, 2011.

TECHNICAL FIELD

The present invention relates to the field of optoelectronic devices, in particular to a substrate. The invention also relates to a method for preparing a substrate, and an organic electroluminescent device using the substrate.

BACKGROUND ART

Organic electroluminescence (Organic Light Emission Diode, hereinafter referred to as OLED), is characterized in high brightness, wide range of material selection, low driving voltage, full solidification active light-emitting, etc., and has advantages such as high definition, wide visual angle, fast response, etc., which meet the development trend of the mobile communication and information display in the information era and the requirements of green illumination technologies, and is currently the focus of many researchers at home and abroad.

Most of the OLED devices in the prior art use glass as the substrate material for the OLED devices. However, OLED devices produced from glass substrates cannot bend. In addition, poor toughness and fragility of glass limit the applications of OLED. In recent years, many researchers have used materials such as polymer films, ultra-thin glass, metal foil, etc. as substrates for OLED, and flexible OLED devices have been obtained by using these flexible materials. However, some problems arise in using these materials. For example, polymer films have poor thermal stabilities and high water- and oxygen-permeabilities. On the other hand, metal foils have high surface roughnesses, and process for producing the device is complicated, and the light-emitting performance thereof is not good enough. The toughness of ultra-thin glass is insufficient, and the price thereof is high.

As one of the most commonly used materials in our life, paper has a wide range of applications. In comparison with the above materials, paper has advantages including wide range of sources, great variety and low price. However, paper also has some shortcomings, such as insufficient toughness, flammability, liability to absorb moisture, and high oxygen-permeability. These problems should be solved in order to use this paper material having low costs and wide range of sources as the substrate for OLED devices.

SUMMARY OF THE INVENTION

In view of the above problems, the present invention provides a substrate which is convenient to obtain, simple to produce, and low in costs.

The technical solutions of the present invention include the followings.

A substrate, which comprises a paper layer, a first protective layer provided at lower surface of the paper layer, and a second protective layer covering upper surface of the paper layer; wherein the paper layer may be any one of drawing paper, kraft paper, coated paper and printing paper, the paper layer may have a thickness of 0.1-0.5 mm; the first protective layer and the second protective layer may be polyethylene terephthalate (PET) heat-sealable films coated with polyvinylidene chloride (PVDC) on both sides, and the heat-sealable film may have a thickness of 18-40 $\mu m$.

The above substrate may further comprise a buffer layer provided on the second protective layer; the buffer layer may be a hardened buffer layer produced by coating with UV curable resin, and the buffer layer may have a surface hardness of 2 H-3 H.

The present invention further provides a method for preparing the above substrate, which comprises the following steps:

(1) Sandwiching a paper layer between two flat steel plates, pressing at 0.2 MPa, placing in a vacuum oven at a temperature of 40° C. and a vacuum degree of 0.01 MPa, and drying for 10-20 hours, to remove residual water in the paper;

(2) Pressing on a platen press at a pressure of 0.5 MPa for 30-60 seconds after the paper layer is dried; and (3) Sandwiching the paper layer between a first protective layer and a second protective layer after the paper layer is pressed, bonding the two heat-sealable films, i.e. the first and second protective layers, with the paper layer by a heat-sealing process, to produce the substrate.

The above method for preparing the substrate may further comprise the steps of: providing a buffer layer on a surface of the second protective layer after the two heat-sealable films, i.e. the first and second protective layers, are bonded with the paper layer.

The present application further relates to an organic electroluminescent device, which comprises a substrate, an anode layer provided on a surface of the substrate, an organic electroluminescent functional layer provided on a surface of the anode layer, and a cover plate covering the functional layer; wherein said substrate comprises a paper layer, a first protective layer provided at lower surface of the paper layer, and a second protective layer covering upper surface of the paper layer.

In the substrate produced according to the present invention, paper material is protected with a PET heat-sealable film coated with PVDC, thereby solving the problems of paper material, including liability to absorb moisture, and high oxygen-permeability. Meanwhile, the materials used for the substrate are inexpensive, widely available, and simple to produce. The obtained substrate has a good flexibility, and significantly better water- and oxygen-impermeabilities than ordinary PET substrates.

SPECIFIC EMBODIMENTS

Figure 1:
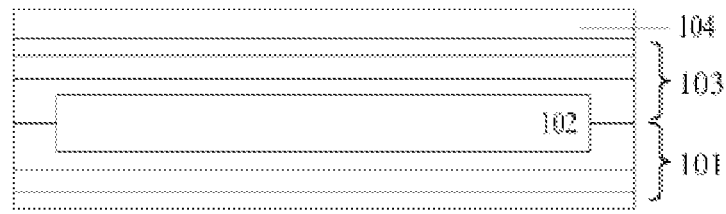
FIG. 1 shows a schematic structure of a substrate according to the present invention; wherein: 101, the first protective layer; 102, the paper layer; 103, the second protective layer; and 104, the hardened buffer layer.

The present invention provides a substrate for an organic electroluminescent device, which, as shown in FIG. 1, comprises a paper layer 102, a first protective layer 101 provided at lower surface of the paper layer 102, and a second protective layer 103 covering upper surface of the paper layer 102; wherein the paper layer 102 may be any one of drawing paper, kraft paper, coated paper and printing paper, the paper layer may have a thickness of 0.1-0.5 mm; the first protective layer and the second protective layer may be polyethylene terephthalate (PET) heat-sealable films coated with polyvinylidene chloride (PVDC) on both sides, and the heat-sealable film may have a thickness of 18-40 μm.

The above substrate may further comprise a buffer layer 104 provided on the second protective layer; the buffer layer may be a hardened buffer layer produced by coating with UV curable resin, and the buffer layer may have a surface hardness of 2 H-3 H (pencil hardness). At this time, the total thickness of the substrate may be about 0.1-0.25 mm.

Figure 2:
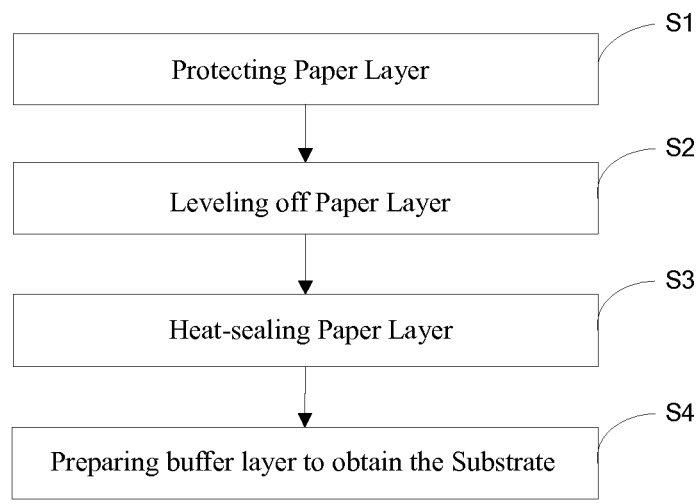
FIG. 2 shows a flow chart of the method for preparing the substrate according to the present invention.

The method for preparing the above substrate is shown in FIG. 2, which comprises the following steps:

S1, Sandwiching a paper layer between two flat steel plates, pressing at 0.2 MPa, placing in a vacuum oven at a temperature of 40° C. and a vacuum degree of 0.01 MPa, and drying for 10-20 hours, to remove residual water in the paper;

S2, Pressing on a platen press at a pressure of 0.5 MPa for 30-60 seconds after the paper layer is dried; and S3, Sandwiching the paper layer between a first protective layer and a second protective layer after the paper layer is pressed, bonding the two heat-sealable films, i.e. the first and second protective layers, with the paper layer by a heat-sealing process; after bonding, sandwiching the bonded film between two PET heat-sealable films coated with PVDC on both sides and conducting a heat-sealing process; repeating the above heat-sealing process for 3-5 times, to produce the substrate.

As shown in FIG. 2, the above preparation method may comprise the step of:

S4, Providing a buffer layer on a surface of the second protective layer after the two heat-sealable films, i.e. the first and second protective layers, are bonded with the paper layer.

In the above preparation method, in order for the paper layer to be moisture-proof and oxygen-impermeable, the paper layer should be protected between the first protective layer 101 and the second protective layer 103. Before the protection treatment, the paper layer should be dried. The specific drying process comprises sandwiching the paper layer between two flat steel plates, pressing at 0.2 MPa and drying in a vacuum oven at a temperature of 40° C. and a vacuum degree of 0.01 MPa for 10-20 hours. After drying, the paper may be pressed on a platen press at a pressure of 0.5 MPa for 30-60 seconds, in order to prevent uneven surface from occurring during subsequent processes.

The process for protecting the paper layer involves sandwiching the paper layer between the first and second protective layers. Specifically, the material for the first and second protective layers may be PET heat-sealable films coated with PVDC on both sides, and the film may have a thickness of 18-40 μm. The area of the paper is smaller than those of the heat-sealable films, so that the edges of the paper are within the area of heat-sealable films. Then, a heat-sealing process is conducted, during which a roller pressing technology or a platen pressing technology is employed, wherein the upper and lower layers of heat-sealable films are bonded with the paper layer by heating and external pressure, and the heat-sealing temperature may be 120-170° C.

In order to improve the toughness and the water- and oxygen-blocking properties of the substrate material, the surface of the paper layer may be subjected to 3-5 cycles of the heat-sealing process, i.e. covering the upper and lower surfaces of the paper, respectively, with 3-5 layers of PET heat-sealable films coated with PVDC on both sides.

Figure 3:
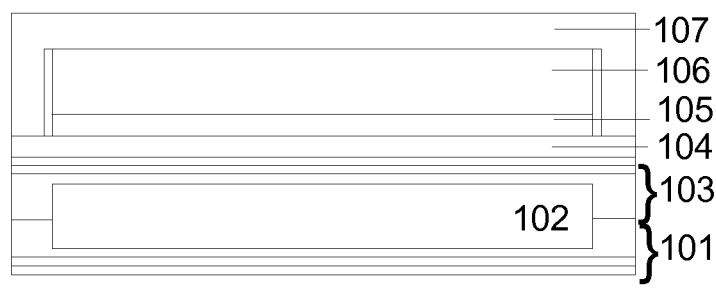
FIG. 3 shows a schematic structure of an organic electroluminescent device according to the present invention; wherein: 101, the first protective layer; 102, the paper layer; 103, the second protective layer; 104, the hardened buffer layer; 105, the anode layer; 106, the OLED functional layer; and 107, cover plate.

The present invention further provides an organic electroluminescent device, as shown in FIG. 3, which comprises the above substrate, an anode layer 105 provided on a surface of the substrate, an organic electroluminescent functional layer provided on a surface of the anode layer 105, and a cover plate covering the functional layer; wherein said substrate comprises a paper layer 102, a first protective layer 101 provided at lower surface of the paper layer 102, and a second protective layer 103 covering upper surface of the paper layer 102.

In practice, the substrate may further comprise a buffer layer 104 produced from UV curable resin. An Ag layer may be provided on a surface of the buffer layer 104 by vacuum evaporation, and used as the anode layer 105 of the organic electroluminescent device. A surface of the anode layer 105 is provided sequentially with functional layers 106 of the electroluminescent device by vacuum evaporation, such as a hole transport layer, a light emitting layer, an electron transport layer, an electron injection layer, and a translucent cathode. In order to effectively protect the functional layers, the functional layers may be covered by a cover plate 107.

The preferred embodiments of the present invention will be further described below in detail referring to the Figures.

EXAMPLE 1

Drawing paper having a thickness of 0.1 mm is dried in a vacuum oven for 10 hours at a temperature of 40° C. and a vacuum degree of 0.01 MPa. The vacuum-dried drawing paper is pressed on a platen press at a pressure of 1.0 MPa for 30 seconds. The paper layer is then sandwiched between two layers of PET heat-sealable films coated with PVDC on both sides and having a thickness of 30 μm, and is heat-sealed. The distance between the edge of the paper and the edge of the heat-sealable films is 1 cm, and the heat-sealing temperature is 150° C. After the heat-sealing is completed, the film prepared above is again sandwiched between two layers of PET heat-sealable films coated with PVDC on both sides, and is heat-sealed at 150° C. The heat-sealing process is repeated for three times so that the paper is covered with 3 layers of heat-sealable films on each side. The protective layer closer to the anode is then covered with UV curable resin by roller pressing technology to form a buffer layer having a surface hardness of 2 H. The obtained paper substrate has a total thickness of 0.16 mm.

EXAMPLE 2

Kraft paper having a thickness of 0.5 mm is dried in a vacuum oven for 20 hours at a temperature of 40° C. and a vacuum degree of 0.01 MPa. The vacuum-dried kraft paper is pressed on a platen press at a pressure of 1.0 MPa for 50 seconds. The paper layer is then sandwiched between two layers of PET heat-sealable films coated with PVDC on both sides and having a thickness of 18 μm, and is heat-sealed. The distance between the edge of the paper and the edge of the heat-sealable films is 1 cm, and the heat-sealing temperature is 150° C. After the heat-sealing is completed, the film prepared above is again sandwiched between two layers of PET heat-sealable films coated with PVDC on both sides, and is heat-sealed at 150° C. The heat-sealing process is repeated for five times so that the paper is covered with five layers of heat-sealable films on each side. The protective layer closer to the anode is then covered with UV curable resin by roller pressing technology to form a buffer layer having a surface hardness of 3 H. The obtained paper substrate has a total thickness of 0.18 mm.

EXAMPLE 3

Coated paper having a thickness of 0.3 mm is dried in a vacuum oven for 30 hours at a temperature of 40° C. and a vacuum degree of 0.01 MPa. The coated paper is pressed on a platen press at a pressure of 1.0 MPa for 60 seconds. The paper layer is then sandwiched between two layers of PET heat-sealable films coated with PVDC on both sides and having a thickness of 40 μm, and is heat-sealed. The distance between the edge of the paper and the edge of the heat-sealable films is 1 cm, and the heat-sealing temperature is 150° C. After the heat-sealing is completed, the film prepared above is again sandwiched between two layers of PET heat-sealable films coated with PVDC on both sides, and is heat-sealed at 150° C. The heat-sealing process is repeated for two times so that the paper is covered with two layers of heat-sealable films on each side. The protective layer closer to the anode is then covered with UV curable resin by roller pressing technology to form a buffer layer having a surface hardness of 2.5 H. The obtained paper substrate has a total thickness of 0.25 mm.

The following embodiments relate to organic electroluminescent devices comprising a substrate according to the invention.

EXAMPLE 4

I. Preparation of the Substrate

Printing paper having a thickness of 0.2 mm is dried in a vacuum oven for 25 hours at a temperature of 40° C. and a vacuum degree of 0.01 MPa. The printing paper is pressed on a platen press at a pressure of 1.0 MPa for 30 seconds. The paper layer is then sandwiched between two layers of PET heat-sealable films coated with PVDC on both sides and having a thickness of 25 μm, and is heat-sealed. The distance between the edge of the paper and the edge of the heat-sealable films is 1 cm, and the heat-sealing temperature is 150° C. After the heat-sealing is completed, the film prepared above is again sandwiched between two layers of PET heat-sealable films coated with PVDC on both sides, and is heat-sealed at 150° C. The heat-sealing process is repeated for four times so that the paper is covered with four layers of heat-sealable films on each side. The protective layer closer to the anode is then covered with UV curable resin by roller pressing technology to form a buffer layer having a surface hardness of 2.5 H. The obtained paper substrate has a total thickness of 0.2 mm.

II. Preparation of an Organic Electroluminescent Device

An Ag layer is prepared on a surface of the buffer layer by vacuum evaporation which is used as the anode of the OLED device. A surface of the anode layer is provided sequentially with functional layers of the electroluminescent device by vacuum evaporation, such as a hole injection layer, a hole transport layer, a light emitting layer, an electron transport layer, an electron injection layer, and a translucent cathode, and is finally covered by a cover plate, to produce the organic electroluminescent device.

COMPARATIVE EXAMPLE 1

Using a PET film as a substrate, an organic electroluminescent device is produced following the method according to Example 4, which has the structure of PET/Ag/hole injection layer/hole transport layer/light emitting layer/electron transport layer/electron injection layer/translucent cathode/packaging cover plate, in which the materials and the thicknesses employed for the anode, the hole injection layer, the hole transport layer, the light emitting layer, the electron transport layer, the electron injection layer, and the translucent cathode, as well as the packaging cover plate, respectively, are the same.

Table 1 shows the comparison of the water- and oxygen-permeation performances of the paper substrates produced in Example 1, Example 2 and Example 3 of the present invention and the ordinary PET substrate at 25° C. As can be seen from Table 1, when the paper layer is protected by PET heat-sealable films coated with PVDC which have very good blocking properties, the water- and oxygen-impermeabilities of the substrates are obviously superior than those of the PET substrate, which effectively solves the problems of paper material, including liability to absorb moisture, and high oxygen-permeability. Meanwhile, by coating with multiple layers of heat-sealable films and a hardened film, the flexibility of the substrate can be improved.

TABLE 1

| | Thickness (mm) | Water permeation rate $(g \cdot m^{-2} d^{-1})$ | Oxygen permeation rate $(cc \cdot m^{-2} d^{-1})$ |
| --- | --- | --- | --- |
| Example 1 | 0.16 | 0.56 | 0.18 |
| Example 2 | 0.18 | 0.32 | 0.11 |
| Example 3 | 0.25 | 0.16 | 0.10 |
| PET film | 0.18 | 4.7 | 2.18 |

Figure 4:
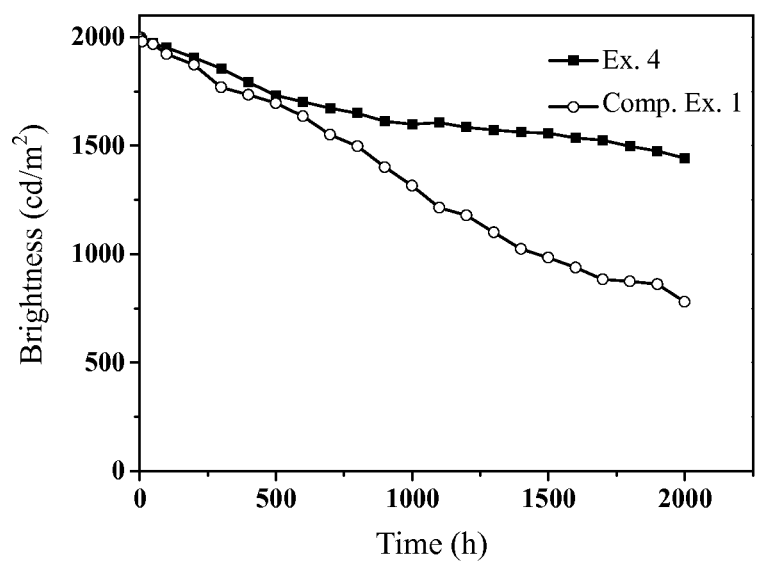
FIG. 4 shows the curves illustrating the changes of the light-emitting brightness of the organic electroluminescent devices produced in Example 4 and Comparative Example 1 over time under the same initial brightness.

FIG. 4 shows the curves illustrating the changes of the light-emitting brightness of the organic electroluminescent devices produced in Example 4 and Comparative Example 1 over time under the same initial brightness. It can be seen from the figure that the paper substrate material produced according to the present invention, due to its better water- and oxygen-permeabilities than the ordinary PET film, leads to a device which has higher stability and longer service life, and is suitable for commercial applications.

It should be understood that, although the above preferred embodiments of the present invention are described in detail, these should not be considered as limitations to the scope of the present invention, which should be subject to the appended claims.

The invention claimed is:
1. A method for preparing a substrate, wherein the method comprises the following steps:
 (1) Sandwiching a paper layer between two flat steel plates, pressing at 0.2 MPa, placing in a vacuum oven at a temperature of 40° C. and a vacuum degree of 0.01 MPa, and drying for 10-20 hours, to remove residual water in the paper;
 (2) Pressing on a platen press at a pressure of 0.5 MPa for 30-60 seconds after the paper layer is dried; and
 (3) Sandwiching the paper layer between a first protective layer and a second protective layer after the paper layer is pressed, bonding the first and second protective layers with the paper layer by a heat-sealing process, to produce the substrate.
2. The method according to claim 1, wherein the method further comprises the steps of: providing a buffer layer on a surface of the second protective layer after the first and second protective layers are bonded with the paper layer.

3. The method according to claim 1, wherein the paper layer is any one of drawing paper, kraft paper, coated paper and printing paper, and the paper layer has a thickness of 0.1-0.5 mm.

4. The method according to claim 1, wherein the first protective layer and the second protective layer are polyethylene terephthalate heat-sealable films coated with polyvinylidene chloride on both sides, and the heat-sealable film has a thickness of 18-40 μm.

5. The method according to claim 2, wherein the paper layer is any one of drawing paper, kraft paper, coated paper and printing paper, and the paper layer has a thickness of 0.1-0.5 mm.

6. The method according to claim 2, wherein the first protective layer and the second protective layer are polyethylene terephthalate heat-sealable films coated with polyvinylidene chloride on both sides, and the heat-sealable film has a thickness of 18-40 μm.

* * * * *